United States Patent [19]
Goldstein et al.

[11] Patent Number: 5,486,489
[45] Date of Patent: Jan. 23, 1996

[54] METHOD OF MANUFACTURING A SEMICONDUCTOR COMPONENT, IN PARTICULAR A BURIED RIDGE LASER

[75] Inventors: Léon Goldstein, Chaville; Dominique Bonnevie, Leuville sur Orge, both of France

[73] Assignee: Alcatel N.V., Amsterdam, Netherlands

[21] Appl. No.: 191,165

[22] Filed: Feb. 3, 1994

[30] Foreign Application Priority Data

Feb. 4, 1993 [FR] France .................................. 93 01212

[51] Int. Cl.$^6$ ................................................. H01L 21/20
[52] U.S. Cl. ........................... 437/129; 148/DIG. 95
[58] Field of Search ..................... 437/129; 148/DIG. 95

[56] References Cited

FOREIGN PATENT DOCUMENTS 32679  2/1987  Japan.
82585  3/1989  Japan.

OTHER PUBLICATIONS

H. Jung et al, "InP/InGaAsP Buried Mesa Ridge Laser: A new Ridge Laser with Reduced Leakage Currents", *Applied Physics Letters*, vol. 54, No. 22, May 29, 1989, pp. 2171–2173.

Primary Examiner—R. Bruce Breneman
Assistant Examiner—Linda J. Fleck
Attorney, Agent, or Firm—Sughrue, Mion, Zinn, Macpeak & Seas

[57] ABSTRACT

In the method, a doped semiconductor coating is to be deposited on a disturbed surface (S) of a semiconductor base (9) doped with a dopant having the same conductivity type as the coating. According to the invention, prior to depositing a main layer (28) of the coating (10), a superdoped layer (24) is deposited, which superdoped layer has a dopant concentration that is greater than twice the mean concentration of the coating. The invention applies in particular to manufacturing a semiconductor laser for an optical fiber telecommunications system.

7 Claims, 2 Drawing Sheets

METHOD OF MANUFACTURING A SEMICONDUCTOR COMPONENT, IN PARTICULAR A BURIED RIDGE LASER

BACKGROUND OF THE INVENTION

The present invention relates to manufacturing certain semiconductor components. Such components are manufactured by depositing a doped coating on a disturbed surface of a base doped with a dopant having the same conductivity type as the coating. The base and the coating are typically made of the same semiconductor material, and, in any event, they must be in crystalline continuity.

The above-mentioned surface is typically disturbed by using an aggressive treatment, such as photolithography. This is necessary in order to form a structure for the component. The coating is typically deposited on the surface by using a known epitaxial deposition method, such as molecular beam epitaxy. The surface therefore constitutes an epitaxial deposition restart layer. It is referred to more succinctly below as the "restart surface".

It has become apparent that components manufactured in that way sometimes suffer from operating defects.

SUMMARY OF THE INVENTION

An object of the present invention is to avoid such defects simply.

According to the invention, the operations of depositing the coating include depositing a superdoped layer in the vicinity of said disturbed surface, which superdoped layer has the same conductivity type and has a dopant concentration that is greater than twice the mean concentration of the coating.

In the context of this invention, it has been found that some of the operating defects observed result from the fact that structural or composition defects in the restart surface locally modify the population of electric charge carriers in the manufactured component. More precisely, they sometimes cause adverse effects in the vicinity of the surface, such as carrier depletion, or conductivity type inversion.

The present invention enables those adverse effects to be avoided.

BRIEF DESCRIPTION OF THE DRAWING

A more detailed description of how the invention may be implemented is given below by way of example and with reference to the accompanying drawings. When the same element is shown in more than one figure, it is designated by the same reference. It is to be understood that the elements mentioned may be replaced by other elements that perform the same technical functions.

DETAILED DESCRIPTION OF THE INVENTION

Figure 3:
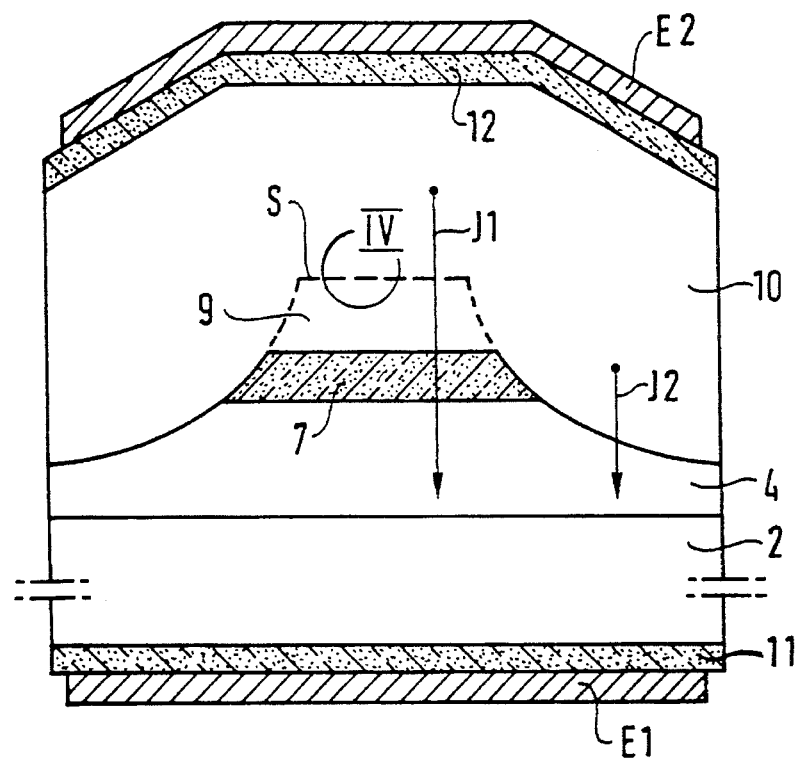
Figure 4:
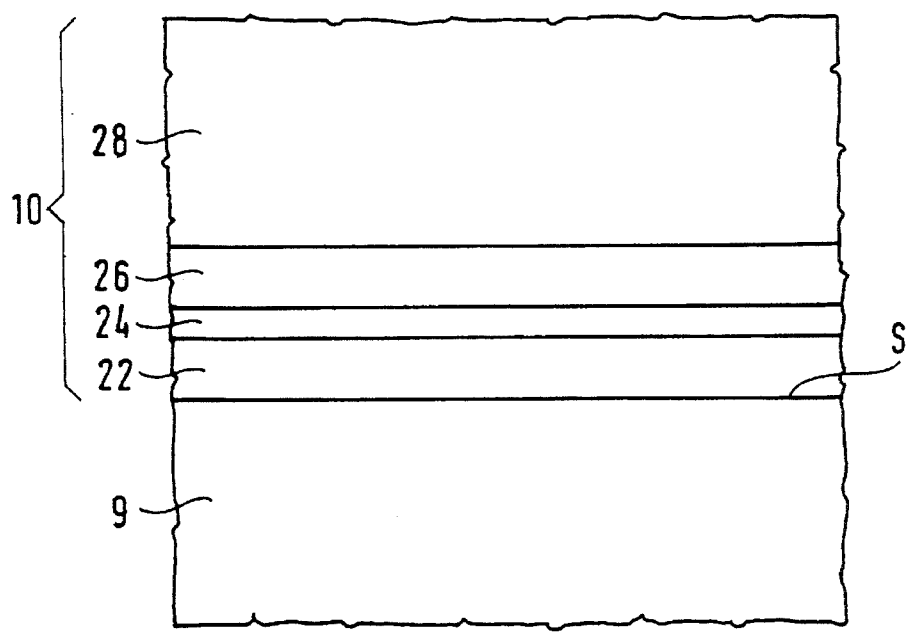
FIG. 4 is a larger-scale view of a detail IV of FIG. 3.

With reference to FIGS. 3 and 4, a general description is given below of a method implementing the present invention for depositing a doped coating 10 on a disturbed surface S of a base 9 doped with a dopant having the same conductivity type as the coating.

For manufacturing a semiconductor component based on indium phosphide, the method includes the following steps which are known per se:

forming a base; the base is made of monocrystalline indium phosphide; it includes layers 2, 4, 6, and a top layer 8 doped with a p-type dopant at a "base" concentration lying in the range $10^{17}$ cm$^{-3}$ to $5.10^{18}$ cm$^{-3}$;

applying aggressive treatment such as etching to the base to form a structure of said component; after the treatment, at least a remaining region 9 of said top layer 8 of the base has a "restart" surface S whose crystalline structure and optionally whose chemical composition are disturbed; and depositing a coating 10 on the restart surface; the coating is made of indium phosphide and includes a p-type dopant constituted by beryllium; the mean concentration of the dopant in the coating is referred to below as the "mean coating concentration"; it lies in the range $10^{17}$ cm$^{-3}$ to $5.10^{18}$ cm$^{-3}$; the deposition is performed by molecular beam epitaxy so that the coating layer is in crystalline continuity with the base layer.

According to the present invention, said step of depositing a coating 10 includes a step of depositing a superdoped layer 24 having a "correction" concentration of beryllium that is greater than $6.10^{18}$ cm$^{-3}$, and that is greater than twice said mean coating concentration. The superdoped layer is deposited at a distance of less than 20 nm from said restart surface S. Preferably the thickness of the superdoped layer lies in the range 5 nm and 20 nm, and the correction concentration lies in the range $10^{19}$ cm$^{-3}$ to $6.10^{19}$ cm$^{-3}$.

Preferably, prior to depositing the superdoped layer 24, an initial restart layer 22 is deposited that has a dopant concentration that is substantially zero and a thickness lying in the range 5 nm to 20 nm.

Also preferably, after depositing said superdoped layer 24, a final restart layer 26 is deposited having a dopant concentration that is less than said mean coating concentration, and having a thickness that is greater than the combined thickness of the initial restart layer 22 and of the superdoped layer 24. After depositing the final restart layer, a main coating layer 28 is deposited having a beryllium concentration that is substantially equal to said mean coating concentration that is to be obtained. The thickness of the main layer is greater than the combined thickness of the initial restart layer 22, of said superdoped layer 24, and of said final restart layer 26.

A description is given below of problems posed by manufacturing a buried-ridge laser and of a method of manufacturing such a laser implementing the present invention.

Such a laser is shown in FIG. 3. Its structure is internationally known as the buried ridge structure (BRS).

Such a structure is described in particular in Documents EP-A-45 678 (CNET) and U.S. Pat. No. 4,441,187. It can also be understood by reading the following description of its manufacture.

The structure incorporates two diodes connected in parallel. One of the diodes is constituted by a useful heterojunction including a p-type top confinement strip 9, a laser strip 7 and an n-type bottom confinement layer 4. The other diode is constituted by a parasitic side homojunction including a p-type coating 10 and the same bottom confinement layer 4.

The diode constituted by the heterojunction conducts under a powering voltage U typically lying in the range 0.6 V to 0.9 V. The diode constituted by the side homojunction conducts under a higher voltage. For intermediate voltages, the current passes mainly at J1 via the heterojunction and therefore through the laser strip 7 with photons being generated by the laser effect. But a parasitic component J2 of the current then also passes via the homojunction. This current component is small insofar as layers 4 and 10 are highly doped. Typically, the doping concentrations are about: $n=1.10^{18}$ cm$^{-3}$ in layer 4 and $p=2.10^{18}$ cm$^{-3}$ in layer 10.

Figure 1:
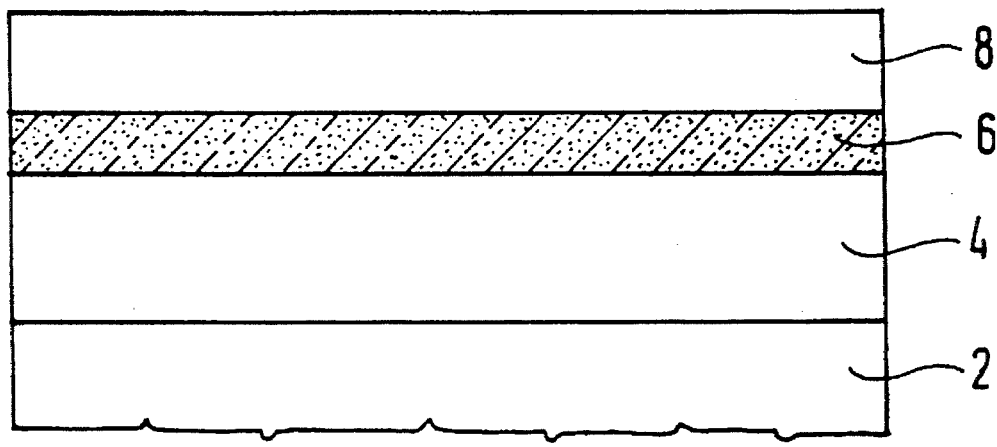
FIGS. 1 to 3 are section views of a buried-ridge semiconductor laser at successive stages of manufacture.
Figure 2:
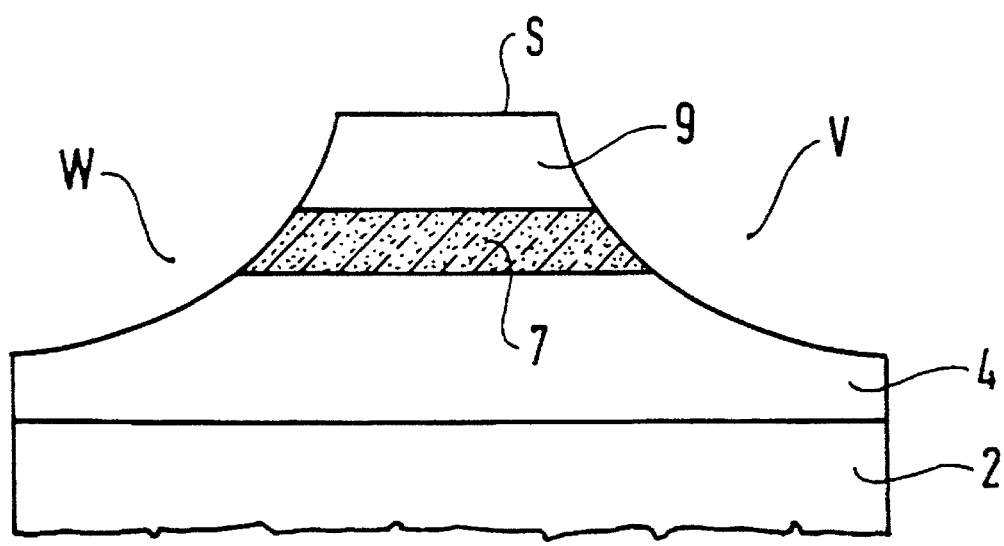

A method of manufacturing such a laser according to the present invention includes the following known steps performed in crystalline continuity on an indium phosphide substrate 2 (see FIG. 1):

forming a bottom confinement layer 4 of n-type indium phosphide;

depositing an active layer 6 of at least ternary composition on the bottom confinement layer;

depositing a top confinement layer 8 of p-type indium phosphide on the active layer; the top confinement layer constitutes the top layer of the above-mentioned base;

etching to remove said top confinement layer and said active layer along two valleys V, W while leaving a plateau 7, 9 that is elongate in a longitudinal direction (see FIG. 2); this etching is conventional-type photolithographic etching; a portion of said active layer and a portion of said top confinement layer remaining in the plateau to constitute a laser strip 7 and a top confinement strip 9 respectively; said etching constitutes the above-mentioned aggressive treatment; it is performed conventionally and uncovers a restart surface S constituted by the exposed surface of said top confinement layer; the surface has defects related to residual impurities (oxygen, carbon, silicon, etc.) or to differences in stoichiometry (phosphorus vacancies, interface states, etc.) which have not been totally removed by chemical cleaning techniques (outside a growth reactor), or insitu cleaning techniques (in a reactor, before restarting the epitaxial deposition); and depositing the above-mentioned indium phosphide coating 10 by means of molecular beam epitaxy; this deposition constitutes the above-mentioned restarting of the deposition; the coating contains a dopant of the p-type constituted by beryllium and includes the following layers:

initial restart layer 22: non-doped InP; thickness: 10 nm;

superdoped layer 24: InP with Be concentration=$3.10^{19}$ cm$^{-3}$; thickness: 10 nm;

final restart layer 26: non-doped InP; thickness: 35 nm; and

Inp doped with Be at the mean coating concentration (typically in the range $7.10^{17}$ cm$^{-3}$ to $10^{18}$ cm$^{-3}$), thickness typically lying in the range 1.5 μm to 3.5 μm.

Contact layers 11 and 12 and electrodes E1, E2 are also formed beneath said substrate 2 and above said coating. The electrodes enable the powering voltage U to be applied, thereby causing a powering current to flow between the electrodes. As explained above, the useful component J1 of the current passes through the heterojunction including the laser strip 7. The charge carriers injected by the useful component enable the laser strip to amplify light guided by the strip in said longitudinal direction. In general, the doping concentrations of said top confinement layer 9, and of said bottom confinement layer 4 are chosen so that there are a range of values for the powering voltage U, the values being such that the parasitic component J2 of the powering current is small compared with the useful component J1 thereof.

A semiconductor component manufactured in accordance with the invention has a good-quality homojunction InP (n/p) at the interface between layers 4 and 10, and electrical continuity InP (p/p) at the interface between layers 9 and 10 that is substantially better than that of analog components manufactured by using known methods. This improvement seems to be related to the following facts.

The above-mentioned defects at the restart surface S are electrically active and constitute n-type donors. After the p-type InP coating has been deposited on the p-type InP base, the presence of n-donor centers at the interface constituted by the surface S may create local carrier depletion, i.e. a p-type region which has low doping because of compensation by the n-donor centers and which is therefore too resistive. The conductivity type may even be inverted on passing through the interface. These depletion or inversion phenomena prevent the component from operating normally.

When deposition is performed using techniques such as liquid phase epitaxy (LPE), vapor phase epitaxy (VPE), or metalorganic vapor phase epitaxy (MOVPE), those phenomena are not too inconvenient insofar as the zinc then used as a the p-dopant for the InP tends to be diffused through the restart surface, and therefore to correct the phenomena. In contrast, when deposition is performed using molecular beam epitaxy, and beryllium is used as the dopant, the fact that beryllium has a relatively low diffusion coefficient means that depletion or inversion phenomena may occur to a considerable extent.

More generally, the advantages of the present invention appear especially when the dopant used has a relatively low diffusion coefficient.

The dopant beryllium tends to be diffused and therefore to correct p-carrier depletion that occurs in the vicinity thereof, when the beryllium concentration in the superdoped layer is greater than $6.10^{18}$ cm$^{-3}$.

When manufacturing the above-described buried ridge laser, the diffusion temperature is typically about 500° C., and the diffusion time is about 30 minutes.

We claim:

1. A method of manufacturing a semiconductor component, the method involving:

forming a semiconductor base (9) which has a cleansed surface (S) and which is doped with a dopant having a conductivity type; and depositing a doped semiconductor coating (10) on said cleansed surface (S), which doped semiconductor coating is doped with a dopant having the same conductivity type as the dopant of the base;

said method being characterized by the fact that depositing said coating (10) involves depositing a superdoped layer (24) atop said cleansed surface (S), which superdoped layer is deposited with a dopant having said same conductivity type and having a concentration that is greater than twice a mean dopant concentration of the coating (10).

2. A method according to claim 1, wherein:

the semiconductor base has a monocrystalline base (2,4, 6,8) including a top layer (8) made of indium phosphide and doped with a p-type dopant at a base concentration lying in the range $10^{17}$ cm$^{-3}$ to $5.10^{18}$ cm$^{-3}$; and further comprising the steps of:

applying aggressive treatment to the base to form a structure of said component such that at least a remaining region (9) of said top layer (8) of the base has a restart surface (S); and depositing a coating (10) on the restart surface, which coating is made of indium phosphide and includes a p-type dopant constituted by beryllium, a mean concentration of the dopant in the coating constituting the mean coating concentration, and lying in the range $10^{17}$ cm$^{-3}$ to $5.10^{18}$ cm$^{-3}$, the deposition being performed by molecular beam epitaxy so that the coating layer is in crystalline continuity with the base;

said method being characterized by the fact that said step of depositing a coating (10) includes a step of depositing a superdoped layer (24) having a correction concentration of beryllium that is greater than $6.10^{18}$ cm$^{-3}$, and that is greater than twice said mean coating concentration, the superdoped layer being deposited at a distance of less than 20 nm from said restart surface (S).

3. A method according to claim 2, characterized by the fact that, prior to said deposition of a superdoped layer (24), said step of depositing a coating (10) includes a step of depositing an initial restart layer (22) having a dopant concentration that is substantially zero and a thickness lying in the range 5 to 20 nm.

4. A method according to claim 3, characterized by the fact that, after deposition of said superdoped layer (24), said step of depositing a coating (10) further includes a step of depositing a final restart layer (26) having a dopant concentration that is less than said mean coating concentration, and, after deposition of the final restart layer, said step of depositing a coating further includes a step of depositing a main coating layer (28), which layer (28) has a beryllium concentration that is substantially equal to said mean coating concentration, and thickness that is greater than the combined thickness of said initial restart layer (22), of said superdoped layer (24), and of said final restart layer (26).

5. A method according to claim 4, characterized by the fact that said final restart layer (26) has thickness that is greater than the combined thickness of said initial restart layer (22) and of said superdoped layer (24).

6. A method according to claim 2, characterized by the fact that said correction concentration lies in the range $10^{19}$ cm$^{-3}$ to $6.10^{19}$ cm$^{-3}$, said superdoped layer (24) having a thickness lying in the range 5 nm and 20 nm.

7. A method of manufacturing a laser of the buried ridge structure (BRS) type, the method making use of the method of any one of claims 2 to 6, and including the following steps performed in crystalline continuity on an indium phosphide substrate (2):

forming a bottom confinement layer (4) of n-type indium phosphide;

depositing an active layer (6) of at least ternary composition on the bottom confinement layer;

depositing a top confinement layer (8) of p-type indium phosphide on the active layer, the top confinement layer constituting said top layer of the base;

etching to remove said top confinement layer and said active layer along two valleys (V, W) while leaving a plateau (7, 9) that is elongate in a longitudinal direction, a portion of said active layer and a portion of said top confinement layer remaining in the plateau to constitute a laser strip (7) and a top confinement strip (9) respectively, said etching constituting said aggressive treatment, and uncovering one of said restart surfaces (S) constituted by the exposed surface of said top confinement layer; and depositing said indium phosphide coating (10) by means of molecular beam epitaxy, which coating includes a dopant of the p-type constituted by beryllium;

said method further including steps of forming electrodes (E1, E2) beneath said substrate (2) and above said coating to enable a powering voltage (U) to be applied, thereby causing a powering current (J1, J2) to flow between the electrodes, the current including a useful component (J1) passing through a heterojunction formed by said top confinement strip (9), by said laser strip (7), and by said bottom confinement layer (4), so as to enable the laser strip to amplify light guided by the strip in said longitudinal direction, the current also including a parasitic component (J2) passing through a homojunction formed between said coating and said bottom confinement layer, the doping concentrations of said top confinement layer (9), of said bottom confinement layer (4), and of said coating (R) being chosen so that one value of said powering voltage (U) makes said parasitic component (J2) small compared with said useful component (J1) of the powering current.

* * * * *